United States Patent
Haugen et al.

(10) Patent No.: US 9,743,527 B2
(45) Date of Patent: Aug. 22, 2017

(54) STENCIL PROGRAMMING AND INSPECTION USING SOLDER PASTE INSPECTION SYSTEM

(71) Applicant: CyberOptics Corporation, Minneapolis, MN (US)

(72) Inventors: Paul R. Haugen, Bloomington, MN (US); Brendan R. Hinnenkamp, Hopkins, MN (US)

(73) Assignee: CyberOptics Corporaiton, Minneapolis, MN (US)

( * ) Notice: Subject to any disclaimer, the term of this patent is extended or adjusted under 35 U.S.C. 154(b) by 479 days.

(21) Appl. No.: 14/452,868

(22) Filed: Aug. 6, 2014

(65) Prior Publication Data
US 2015/0045927 A1    Feb. 12, 2015

Related U.S. Application Data (60) Provisional application No. 61/864,124, filed on Aug. 9, 2013.

(51) Int. Cl.
*G06F 19/00* (2011.01)
*H05K 3/00* (2006.01)
*B25J 9/16* (2006.01)

(52) U.S. Cl.
CPC .............. *H05K 3/00* (2013.01); *B25J 9/1682* (2013.01); *G05B 2219/37215* (2013.01); *G05B 2219/45026* (2013.01)

(58) Field of Classification Search
None
See application file for complete search history.

(56) References Cited

U.S. PATENT DOCUMENTS

| | | | |
|---|---|---|---|
| 5,882,720 A | 3/1999 | Legault et al. | |
| 6,317,513 B2 | 11/2001 | Michael et al. | |
| 6,352,025 B1 * | 3/2002 | Neiconi ................. | B41F 15/20 101/123 |
| 6,610,991 B1 | 8/2003 | Case | |
| 6,750,899 B1 | 6/2004 | Fishbaine et al. | |

(Continued)

FOREIGN PATENT DOCUMENTS

| WO | WO0038494 A2 | 6/2000 |
|---|---|---|
| WO | WO02097534 A2 | 12/2002 |
| WO | WO2008100646 A2 | 8/2008 |

OTHER PUBLICATIONS

Search Report and Written Opinion for International Application No. PCT/US2014/012710, mailing date May 13, 2014. 12 pages.

*Primary Examiner* — Adam Lee
(74) *Attorney, Agent, or Firm* — Christopher R. Christenson (57) ABSTRACT

A system for generating a program used to direct the operation of a solder paste inspection machine is provided. The system includes a solder paste inspection system having a stencil mounting bracket located therein and configured to hold a solder paste printing stencil in position within an inspection region of the solder paste inspection system. An image sensor is mounted in the solder paste inspection system and is configured to acquire images of a stencil mounted on the stencil mounting bracket. A controller is coupled to the image sensor and is configured to generate a solder paste inspection program using the acquired images of the stencil.

12 Claims, 10 Drawing Sheets

(56) References Cited

U.S. PATENT DOCUMENTS

| | | | |
|---|---|---|---|
| 2003/0021886 A1* | 1/2003 | Baele | B41F 15/0818 427/8 |
| 2003/0027363 A1 | 2/2003 | Kodama | |
| 2003/0201303 A1* | 10/2003 | Jones | H05K 3/3421 228/41 |
| 2004/0159787 A1* | 8/2004 | Nakasuji | H01J 37/28 250/311 |
| 2004/0218808 A1* | 11/2004 | Prince | B23K 3/08 382/150 |
| 2004/0244613 A1* | 12/2004 | Barajas | H05K 3/1233 101/130 |
| 2006/0200332 A1* | 9/2006 | Ishimoto | G06F 17/5068 703/13 |
| 2006/0205112 A1* | 9/2006 | Standing | H01L 21/4825 438/106 |
| 2007/0102477 A1* | 5/2007 | Prince | B23K 3/0638 228/39 |
| 2007/0102478 A1* | 5/2007 | Prince | B23K 3/0638 228/39 |
| 2007/0175343 A1* | 8/2007 | Prince | G01N 21/95684 101/123 |
| 2008/0156207 A1* | 7/2008 | Ellenbogen | B41F 15/0818 101/126 |
| 2008/0197170 A1* | 8/2008 | Prince | G01N 21/8806 228/103 |
| 2008/0250950 A1* | 10/2008 | Doyle | B41F 15/0818 101/123 |
| 2008/0250951 A1* | 10/2008 | Klauser | B41F 15/26 101/126 |
| 2009/0205518 A1* | 8/2009 | Doyle | B41F 15/0881 101/124 |
| 2010/0007896 A1 | 1/2010 | Fishbaine | |
| 2011/0222655 A1 | 9/2011 | Murakami et al. | |
| 2012/0145013 A1* | 6/2012 | Doyle | B41F 15/12 101/123 |
| 2012/0145014 A1* | 6/2012 | Doyle | B41F 15/12 101/126 |
| 2012/0145015 A1* | 6/2012 | Doyle | B41F 15/12 101/129 |
| 2012/0145016 A1* | 6/2012 | Doyle | B41F 33/0027 101/129 |
| 2012/0327215 A1 | 12/2012 | Case et al. | |
| 2013/0177698 A1 | 7/2013 | Cherbis et al. | |
| 2013/0199386 A1* | 8/2013 | Lynch | B41F 15/0881 101/123 |
| 2014/0000468 A1* | 1/2014 | Perault | B41F 35/005 101/425 |
| 2014/0210993 A1 | 7/2014 | Butler et al. | |
| 2014/0272103 A1* | 9/2014 | Prince | H05K 3/225 427/8 |
| 2014/0366756 A1* | 12/2014 | Gray | B41F 15/06 101/129 |
| 2015/0033966 A1* | 2/2015 | Ong | B41F 15/12 101/129 |

* cited by examiner

STENCIL PROGRAMMING AND INSPECTION USING SOLDER PASTE INSPECTION SYSTEM

CROSS-REFERENCE TO RELATED APPLICATIONS

The present application is based on and claims the benefit of U.S. Provisional Patent Application Ser. No. 61/864,124, filed Aug. 9, 2013, the content of which is hereby incorporated by reference in its entirety.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Circuit boards that carry electronic integrated circuits and discrete electronic components are well known. A circuit board substrate is prepared with predetermined conductor paths and pads for receiving the leads of electronic components such as integrated circuit chips, resistors or capacitors. During the circuit board assembly process, solder paste deposits are placed onto the board substrate at appropriate positions. The solder paste deposits are usually applied by placing a stencil screen onto the substrate, applying solder paste through the stencil openings and removing the stencil from the substrate. The circuit board electronic components are then positioned onto the substrate, preferably with a pick and place machine, with leads of the electronic components placed on the respective solder paste deposits. The circuit board is passed through an oven after all of the components are positioned on the substrate to melt the solder paste deposits thus creating an electrical as well as mechanical connection between the components and the substrate.

The size of the solder paste deposits and electronic components and the accuracy with which they must be placed on the substrate has become increasingly smaller and tighter with the increased emphasis on miniaturization in the electronics industry. Solder paste deposit heights can be as small as 50 microns and the height of the solder paste brick must often be measured to within 1 percent of the designed height and size. The center-to-center spacing between solder bricks is sometimes as little as 200 microns. Too little solder paste can result in no electrical connection between the lead of an electronic component and the pad of the circuit board substrate. Too much paste can result in bridging and short-circuiting between the leads of a component. Discrete electronic components such as resistors and capacitors can be as small as 200×400 microns and leads on micro ball grid array components can have a center-to-center spacing less than 300 microns.

A single circuit board can cost thousands and even tens of thousands of dollars to manufacture. Testing of a circuit board after the fabrication process is complete can detect errors in solder paste placement and component placement and lead connection, but often the only remedy for a faulty board is rejection of the entire board. In addition, with the miniaturization of components, visual inspection of the circuit board, even with optical magnification, is unreliable.

It is accordingly imperative that a circuit board be inspected during the fabrication process so that improper solder paste placement can be detected prior to the placement of the electronic components onto the substrate. Such in-process solder inspection reduces the cost of failure since expensive components have not yet been placed onto the circuit board.

To ensure proper operation of a solder paste inspection system, the system must be programmed or otherwise taught where on the circuit board the solder paste is to be printed and the expected shape and size of each of the solder paste deposits. This information is required by the inspection system so that measured solder paste deposits' position, height, shape and volume can be compared with expected target values. In previous techniques for programming solder paste inspection systems, computer-aided-design (CAD) files were used and converted into a suitable file format usable by the inspection system. The CAD files used to determine the position and shape of the solder paste deposit are typically in a format called GERBER which is a plotter command based description of the stencil apertures. Typically, conversion of the GERBER file to a solder paste inspection program requires a sophisticated conversion software package which requires trained personnel to operate. In addition, the CAD files that describe the stencil design are occasionally not available to operators setting up a circuit board assembly line which makes it impossible to set up the solder paste inspection system for that circuit board assembly.

Also, there may be an error the fabrication of the stencil or the operator may want to verify the stencil in question matches the CAD data used to fabricate the circuit board.

During the solder paste printing process, a squeegee is drawn across the stencil and solder paste is forced through the stencil apertures to form the solder paste deposit on the circuit board. The process of drawing the squeegee across the stencil stretches and deforms the stencil. Also, repeated use of the stencil can produce dents and deformities in the stencil. The stretching and coining of the stencil over time reduces the quality of the solder printing process. Currently, there is no effective method of determining if a stencil needs to be replaced due to this type of wear.

SUMMARY

A system for generating a program used to direct the operation of a solder paste inspection machine is provided. The system includes a solder paste inspection system having a stencil mounting bracket located therein and configured to hold a solder paste printing stencil in position within an inspection region of the solder paste inspection system. An image sensor is mounted in the solder paste inspection system and is configured to acquire images of a stencil mounted on the stencil mounting bracket. A controller is coupled to the image sensor and is configured to generate a solder paste inspection program using the acquired images of the stencil.

DETAILED DESCRIPTION OF ILLUSTRATIVE EMBODIMENTS

Various embodiments of the present invention provide a solder paste inspection system that is modified to accept and mount a solder paste print stencil within the system in a position that places the stencil within the measurement envelope of the solder paste inspection sensor. Using the sensor, the stencil can be inspected using the 2D and/or 3D image acquisition capability of the inspection system.

Figure 1:
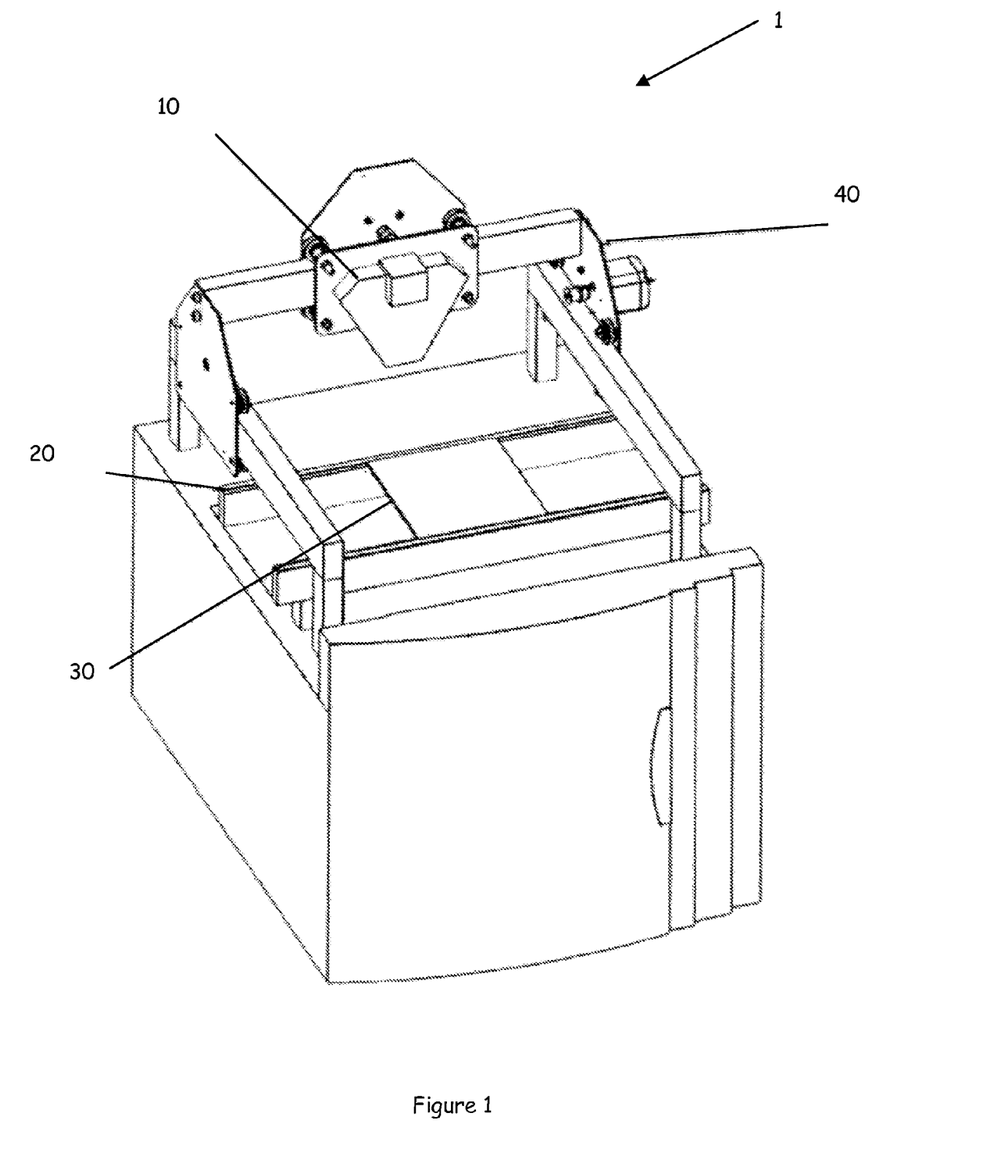
FIG. 1 is a diagrammatic view of a solder paste inspection system with which embodiments of the present invention are useful.

FIG. 1 is a diagrammatic view of a solder paste inspection system with which embodiments of the present invention are useful. Solder paste inspection system 1 includes solder paste inspection sensor 10 disposed above circuit board 30 on robotic gantry 40. Circuit board 30 is supported by circuit board conveyance apparatus 20, which in some embodiments may be a conveyor. Solder paste inspection sensor 10 is moveable relative to circuit board 30 in two axes in order to bring portions of circuit board 30 into the field of view of sensor 10. In accordance with known techniques, solder paste inspection sensor 10 acquires one or more images of solder paste deposits on circuit board 10 in order to ensure that the correct amount of solder paste is deposited at the correct locations of circuit board 30.

Figure 2:
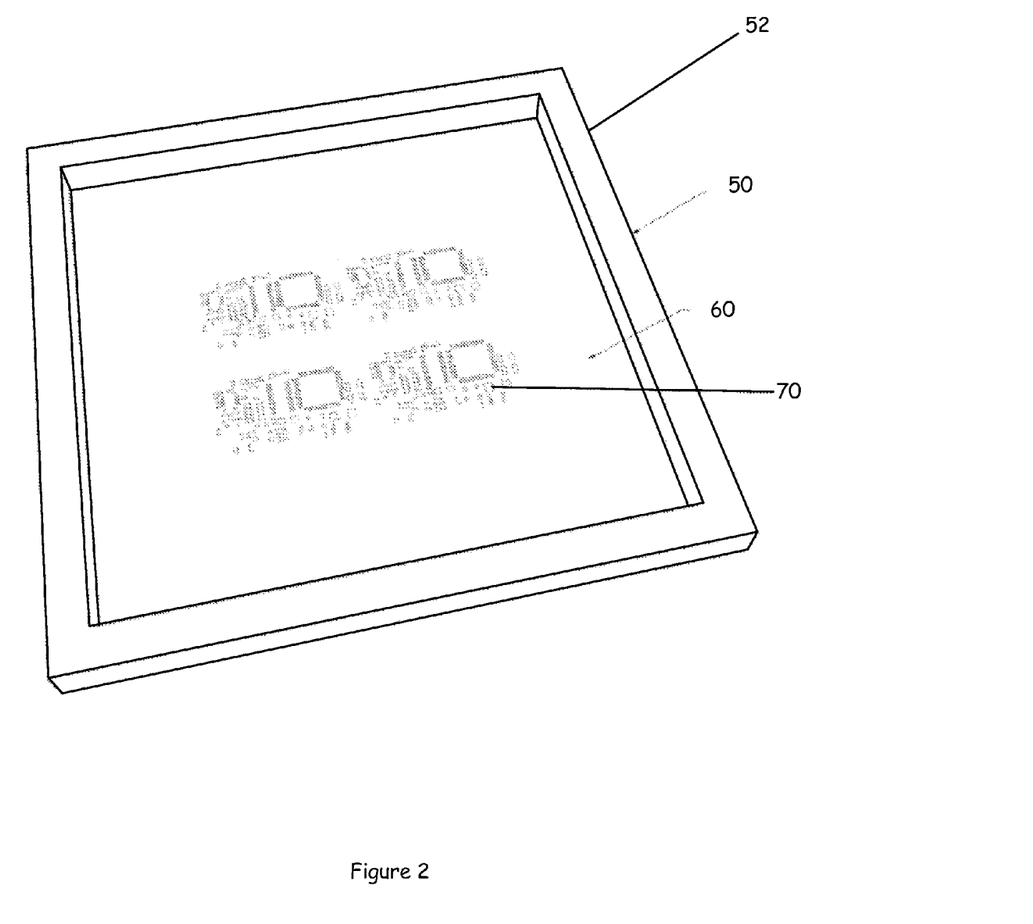
FIG. 2 is a diagrammatic view of a solder paste print stencil with which embodiments of the present invention are useful.
Figure 10:
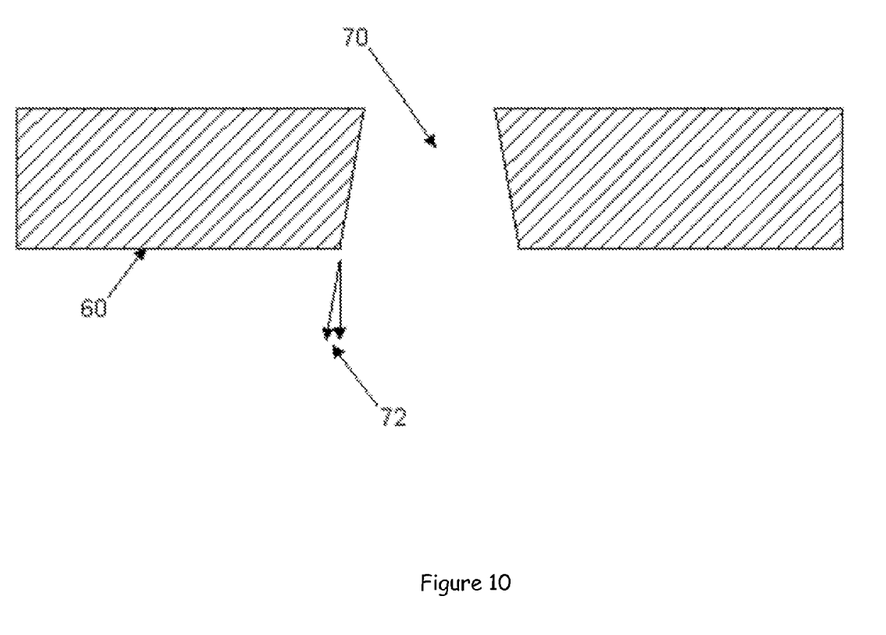
FIG. 10 is a diagrammatic cross-section view of a stencil screen aperture.

FIG. 2 is a diagrammatic view of a solder paste print stencil with which embodiments of the present invention are useful. Stencil 50 includes a frame 52 that maintains stencil screen 60 in tension. Stencil screen 60 is generally formed of a metal such as stainless steel or nickel. Apertures 70 (shown in FIG. 10) in stencil 50 are formed using any suitable process such as electroforming or laser cutting. In either case, CAD data is used to control the formation of apertures 70 through stencil screen 60, which apertures 70 allow solder paste therethrough in order to deposit the solder paste on a circuit board. As set forth above, as the stencil is repeatedly used, the squeegee is repeatedly drawn across stencil 50. Over time, the repeated use can produce dents and deformities in the stencil which can adversely affect solder paste deposit placement.

Figure 3:
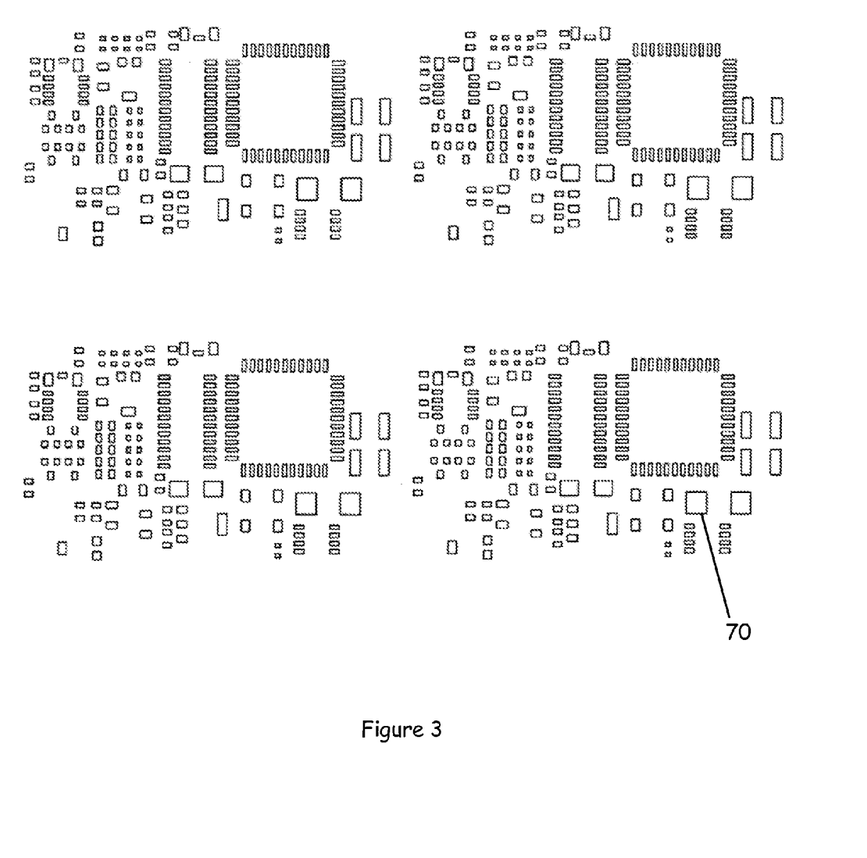
FIG. 3 is an example of CAD data used to describe a solder paste print stencil.

FIG. 3 is an example of CAD data used to describe a solder paste print stencil. The CAD data generally defines the location, size and shape of each aperture on the stencil. While the CAD data used to form the stencil would be of use to the solder paste inspection system, it is sometimes not available to operators of the inspection systems, or is not in a format that is easily amenable to programming the inspection system.

Figure 4:
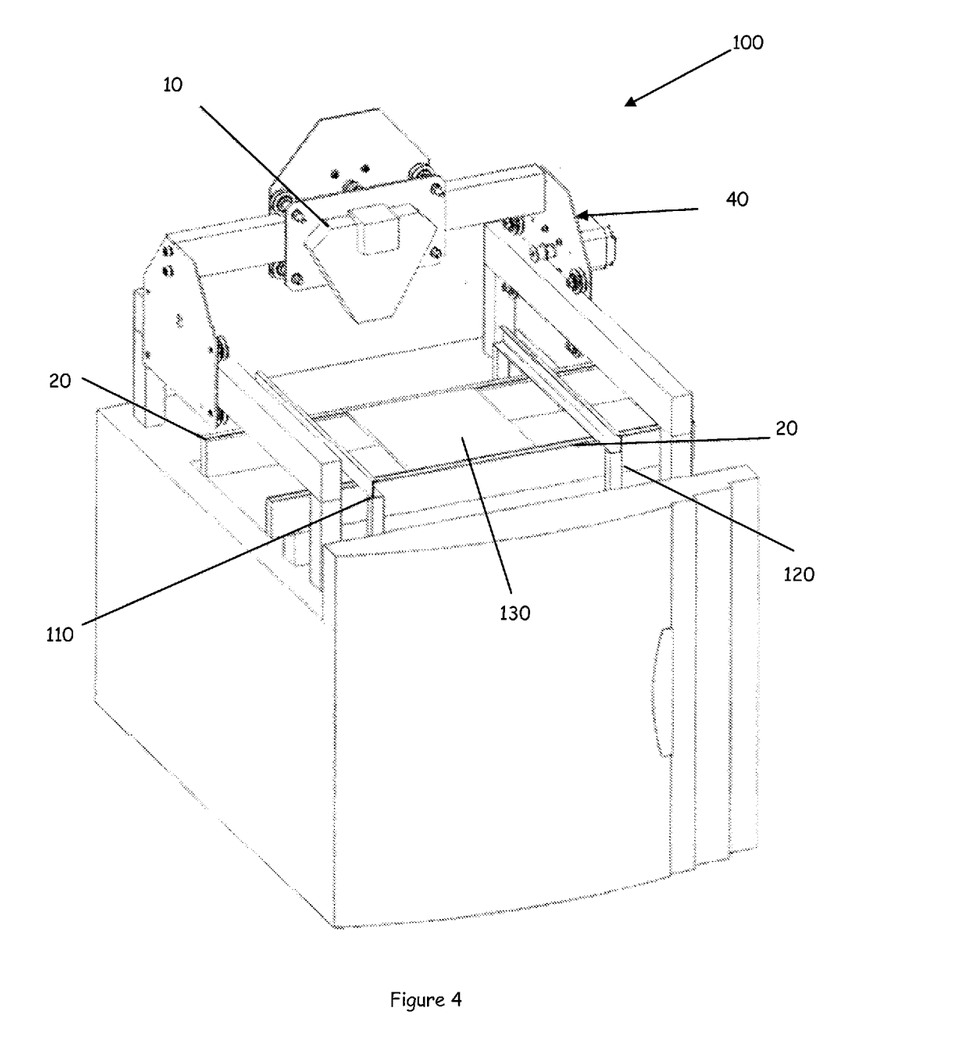
FIG. 4 is a diagrammatic view of a solder paste inspection system modified with mounting features designed to hold a solder paste print stencil in a position that is within the inspection envelope of the solder paste inspection sensor in accordance with an embodiment of the present invention.

FIG. 4 is a diagrammatic view of a solder paste inspection system modified with mounting features designed to hold a solder paste print stencil in a position that is within the inspection envelope of the solder paste inspection sensor in accordance with an embodiment of the present invention. System 100 bears some similarities to system 1, shown in FIG. 1, and like components are numbered similarly. In contrast to system 1, system 100 includes a pair of mounting brackets 110, 120 that are positioned on opposite sides of circuit board inspection region 130. Each of mounting brackets 110, 120 includes a channel that faces the other bracket such that a solder paste stencil can simply be inserted into system 100 from the front. In some embodiments, one or both of brackets 110, 120 may be positionable such that various widths of stencils can be accommodated. Further, in embodiments where bracket(s) 110, 120 are movable, system 100 can include one or more positional encoders such that system 100 will only obtain images within the field of view between brackets 110 and 120.

Figure 5:
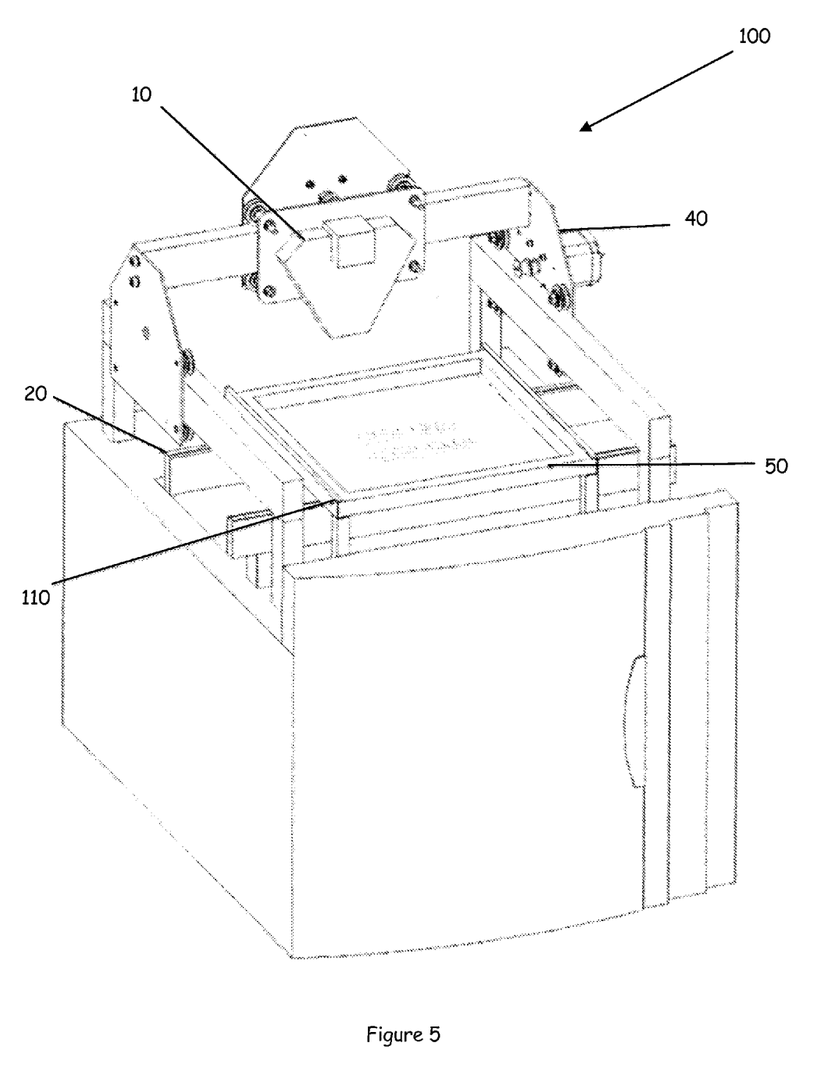
FIG. 5 is a diagrammatic view of a solder paste printing stencil properly mounted for inspection by a solder paste inspection machine over the circuit board handling conveyor.

FIG. 5 is a diagrammatic view of a solder paste printing stencil 50 properly mounted for inspection by a solder paste inspection machine 100 over the circuit board handling conveyor 20. When mounted within system 100, stencil 50 sits between channels of each bracket 110, 120 and above conveyor 20. Solder paste inspection sensor 10 acquires one or more images of stencil 50, much as it would acquire images of a circuit board, and provides the images for analysis. Using known image analytics, the image(s) from sensor 10 are processed to identify the position, shape and size of apertures 70 in stencil 50. This information is converted to a computer-aided design file that is readable by the solder paste inspection system. In this way, the conversion of a GERBER file, using a sophisticated software conversion package is avoided. The CAD file can then be used by the solder paste inspection system itself, or other automated optical inspection machines in the assembly line, for inspecting boards printed with stencil 50. Further, in embodiments where the original CAD data used to produce stencil 50 is available, the original CAD data can be contrasted with the CAD data generated by system 100, in order to assess wear or damage to stencil 50.

Figure 6:
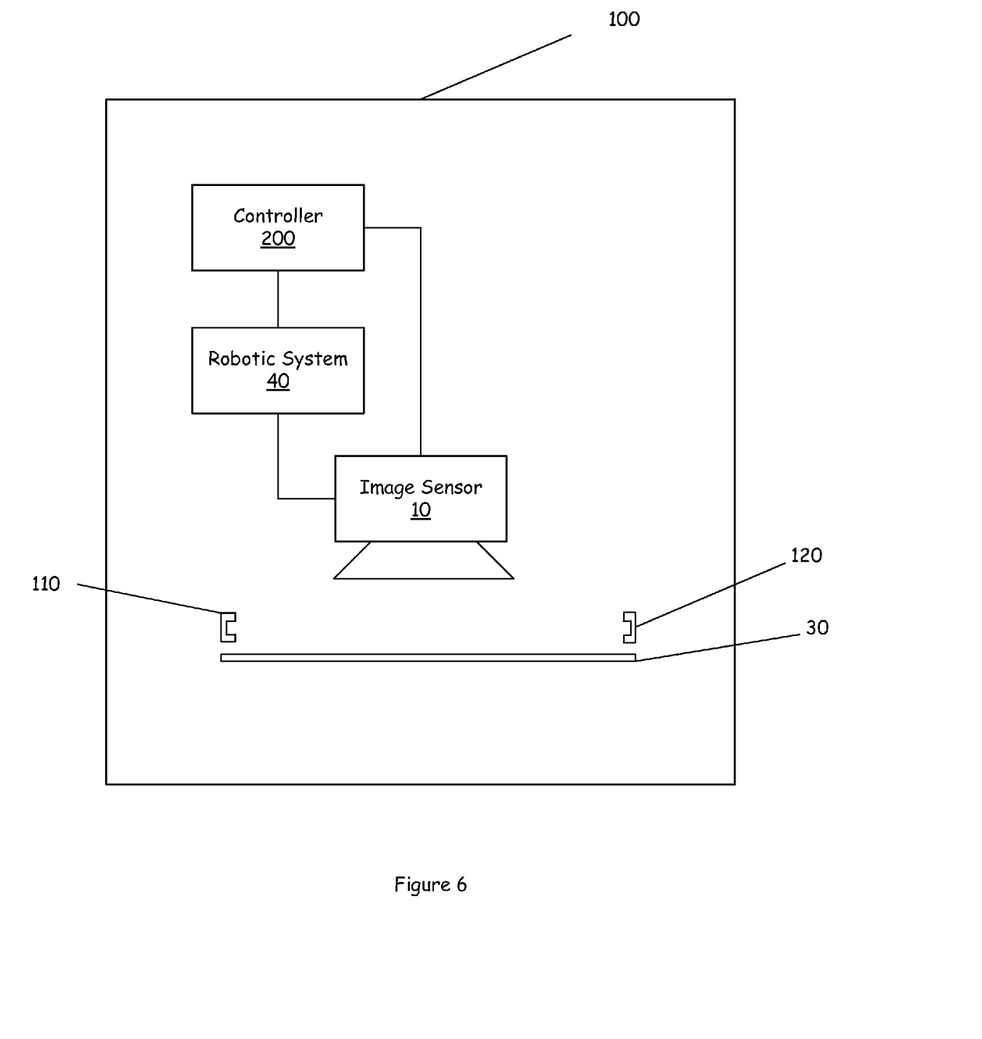
FIG. 6 is a diagrammatic block diagram of a solder paste inspection system in accordance with an embodiment of the present invention.

FIG. 6 is a diagrammatic block diagram of a solder paste inspection system in accordance with an embodiment of the present invention. System 100 includes a controller 200 coupled to robotic system 40. Controller 200 can obtain positional information regarding robotic system 40 and command motors of system 40 to move the gantry in one or both axes. Thus, controller 200 is able to precisely set the position of sensor 10 relative to the circuit board or solder paste stencil. Solder paste inspection sensor 10 is mechanically coupled to robotic system 40 and communicatively coupled to controller 20. Sensor 10 may include suitable optics to ensure that suitable images can be obtained for circuit boards (during inspection) and a stencil (during programming). Alternatively, in embodiments where the focal plane of sensor 10 is not adjustable, an actuator can be used to lift sensor 10 sufficiently to maintain proper focus at the higher elevation, since stencil 50 sits above the location of circuit board 30. As shown in FIG. 6, the pair of brackets 110, 120 are provided as part of system 100 and are located above the position of circuit board 30.

Figure 7:
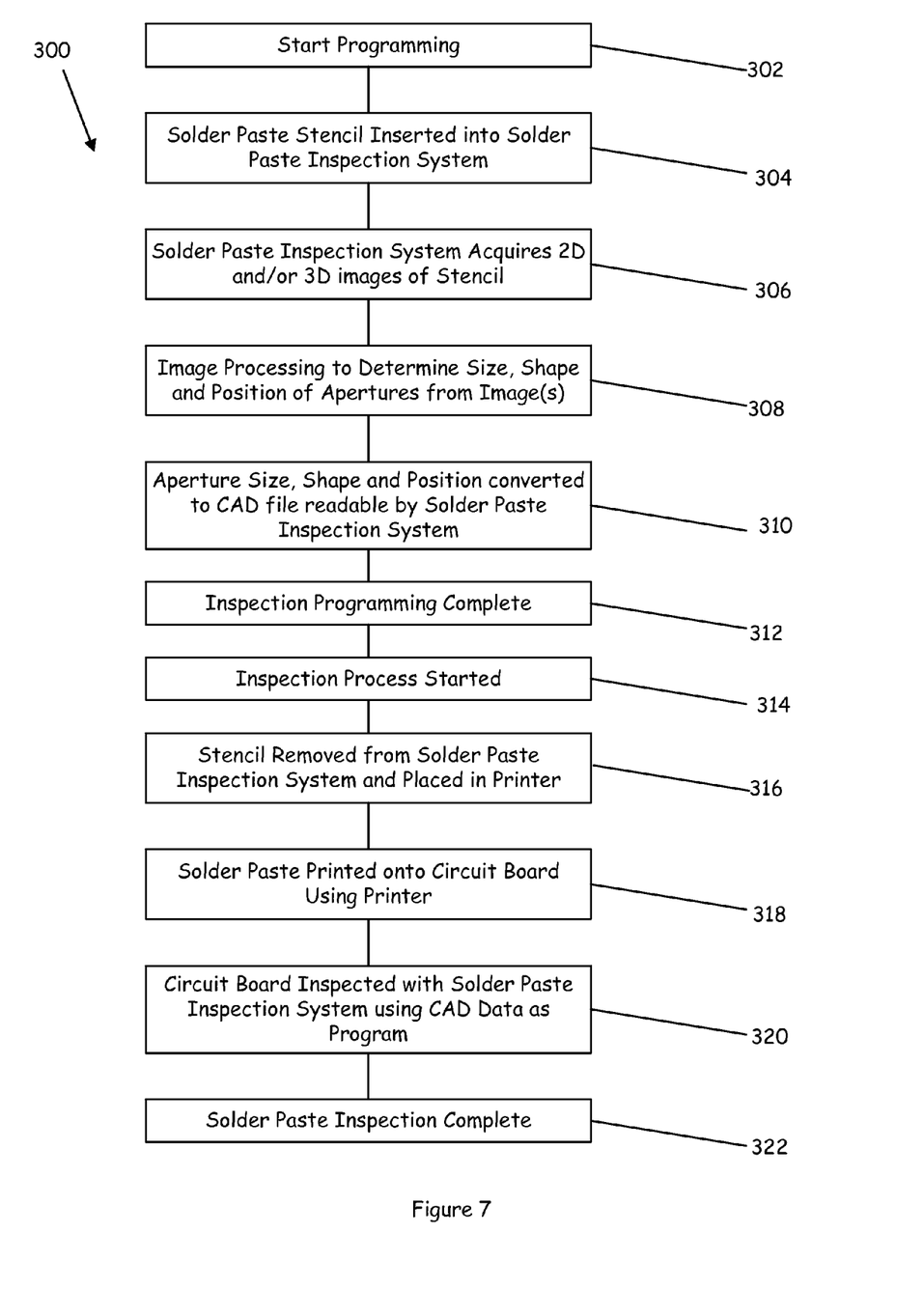
FIG. 7 is flow diagram describing the process of using a solder paste inspection system to generate CAD data which can be used to direct the solder paste inspection system.

FIG. 7 is flow diagram describing the process of using a solder paste inspection system to generate CAD data which can be used to direct the solder paste inspection system. Method 300 begins at block 302 where the programming process is initiated. Such initiation is, in one embodiment, provided by a technician engaging a "Start Programming" button or other suitable user interface element of a solder paste inspection system, such as system 100. Next, at block 304, a solder paste stencil, such as stencil 50, is inserted into the solder paste inspection system. At block 306, the solder paste inspection system acquires two dimensional and/or three dimensional images of the stencil. Three dimensional images can be acquired using known stereoscopic techniques and/or using known three dimensional phase profilometry techniques. At block 308, image processing techniques are employed to determine the size, shape and position of apertures 70 in the stencil. Such processing occurs, in one embodiment, within the controller of the solder paste inspection system. However, any processor or computing device that is able to perform the image processing can be employed. At block 310, the aperture size, shape and position information is converted to a CAD file that is readable by the solder paste inspection system. At block 312 programming is completed by providing the CAD file to the solder paste inspection system in order to program the solder paste inspection system to inspect solder paste deposits on boards that are printed using the stencil.

Method 300 continues at block 314 where the solder paste inspection system in placed in inspection mode, once programmed as set forth above. At block 316, the stencil is removed from the solder paste inspection system thereby allowing the solder paste inspection sensor to view the area below where circuit boards will be conveyed. At block 318, in accordance with known techniques, the solder stencil is used to deposit solder paste on a circuit board using a board printer. At block 320, the printed circuit board is placed or otherwise conveyed into the solder paste inspection system and is inspected using the CAD program provided at block 312. At block 322, the inspection process for the board is complete and the solder paste inspection system is ready to inspect the next board printed with the stencil.

Figure 8:
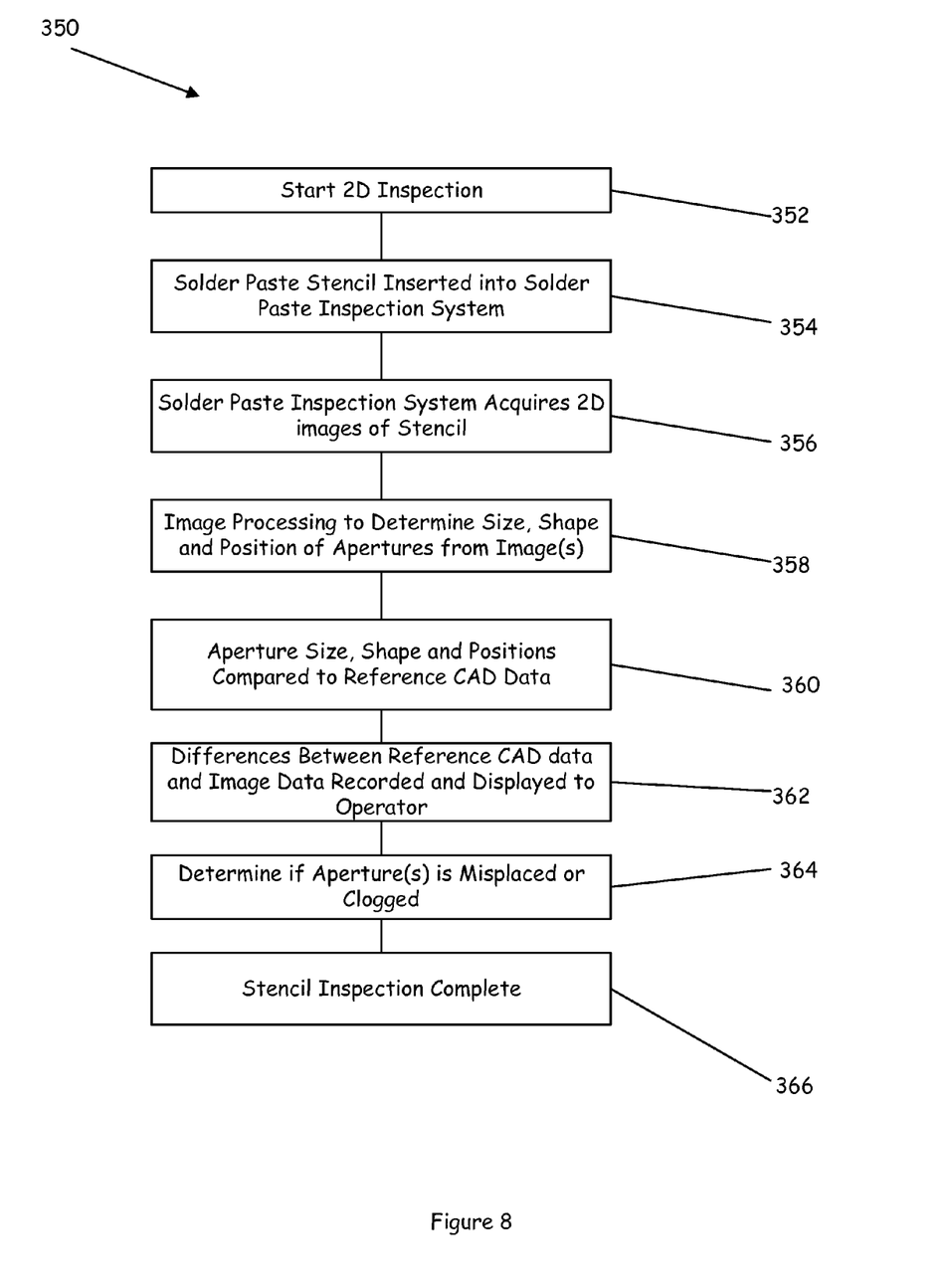
FIG. 8 is a flow diagram describing the process of inspecting a solder paste print stencil for damage and clogged apertures using a solder paste inspection system in accordance with an embodiment of the present invention.

FIG. 8 is a flow diagram describing the process of inspecting a solder paste print stencil for damage and clogged apertures 70 using a solder paste inspection system in accordance with an embodiment of the present invention. Method 350 begins at block 352 where two-dimensional inspection of the solder paste print stencil in initiated. The inspection can be performed within a solder paste inspection system in accordance with embodiments of the present invention or any other suitable optical inspection system that is able to acquire and analyze images of the stencil. At block 354, the solder paste print stencil is inserted into the solder paste inspection system or other suitable system. Next, at block 356, the inspection system acquires one or more two-dimensional images of the solder paste print stencil. At block 358, image processing techniques and method are used to recognize aperture shape, size and position in the stencil relative to the stencil's fiducial coordinate system. At block 360, the controller compares the aperture size, shape and position information to reference CAD data. This reference CAD data is preferably obtained from the designer of the printed circuit board and/or stencil. At block 362, the differences between the reference CAD data and the aperture size, shape and position information obtained from optical inspection is recorded and displayed to an operator. By determining the equivalence between the physical stencil and the CAD data, the operator can verify that the proper stencil is being used for the current assembly process. At block 364, based on the displayed differences, it is determined, by an operator or system controller, whether one or more apertures 70 of the stencil are misplaced and/or clogged, for example by dry solder paste. Additionally, by comparing the actual positions of the apertures 70 with the CAD data, the amount of stencil stretch can be measured. At block 366, the two-dimensional inspection of the stencil is complete. If the stencil has passed two-dimensional inspection, it may be suitable for continued use. However, if the inspection process has identified damage, the stencil may need to be repaired or replaced before additional boards can be printed. However, if the stencil does need to be replaced, the solder paste inspection system can be easily programmed with the new stencil. In this way, minor variations between stencils, even for boards of the same design, can be accommodated for more accurate solder paste inspection.

Figure 9:
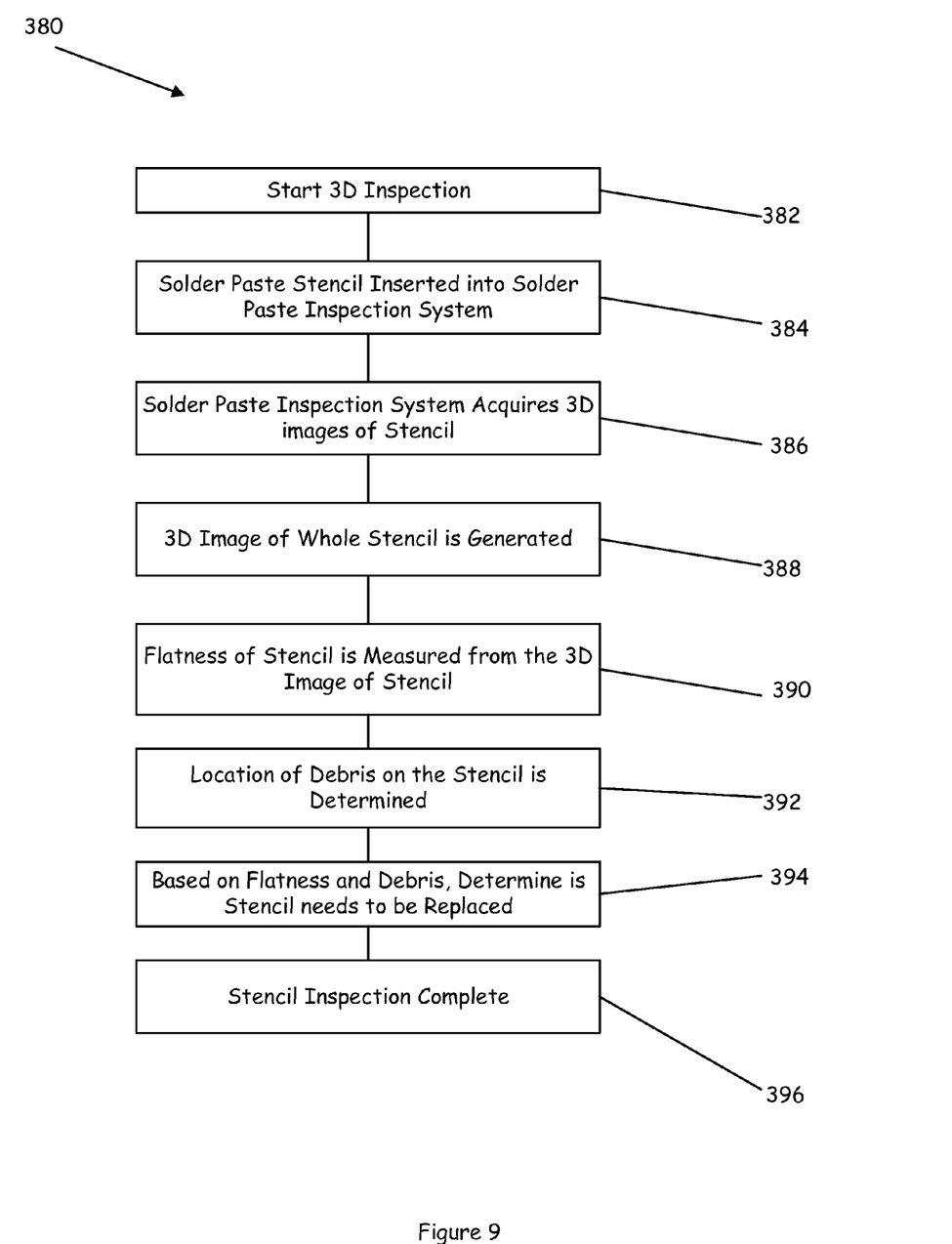
FIG. 9 is a flow diagram of a method of inspecting a solder paste print stencil for damage using 3D images.

FIG. 9 is a flow diagram of a method of inspecting a solder paste print stencil for damage using 3D images. Some of the wear and/or damage that can occur to a stencil is not detectable using two-dimensional imaging techniques. Thus, embodiments of the present invention also include the three-dimensional inspection of the stencil in order to detect additional forms of wear or damage. For example, three dimensional inspection of the stencil can measure the flatness of the stencil to detect bowing and/or warpage. Method 380 begins at block 382 where the three dimensional inspection process is initiated. Next, at block 384, the solder paste stencil is loaded into the solder paste inspection system or other suitable optical inspection system. At block 386, three dimensional images of the stencil are acquired. At block 388, the three dimensional images acquired during block 386 are assembled into a three dimensional image of the entire stencil. At block 390, the flatness of the stencil is measured or otherwise computed from the three-dimensional image. At block 392, the three dimensional image data is used to determine the location of any debris or other three dimensional structure on the stencil. At block 394, the flatness (determined at block 390) and the debris location (determined at block 392) are evaluated to determine if the stencil needs to be reworked or replaced. At block 396, the three dimensional inspection of the stencil is complete. If the stencil has passed three-dimensional inspection, it may be suitable for continued use. However, if the inspection process has identified damage, the stencil may need to be repaired or replaced before additional boards can be printed. However, if the stencil does need to be replaced, the solder paste inspection system can be easily programmed with the new stencil, as set forth above.

In an additional embodiment, the stencil screen 60 is inspected on both top and bottom sides. By comparing the size and shape of each aperture 70 as seen from each side of stencil 50, the interior construction of the aperture can be derived. Shown as a cross section in FIG. 10, a typical aperture 70 is formed with non-vertical sides known as a draft angle 72. Fabricating apertures 70 with a correct draft angle 72 ensures proper release of the solder paste onto the circuit board 30 during the printing process. The top side is first inspected using either the two-dimensional method 350 described with respect to FIG. 8 or the three-dimensional method described with respect to FIG. 9. The stencil 50 is then removed from solder paste inspection system 1, flipped, and remounted into inspection system 1. The bottom side is similarly inspected using two- or three-dimensional inspection methods.

Although the present invention has been described with reference to preferred embodiments, workers skilled in the art will recognize that changes may be made in form and detail without departing from the spirit and scope of the invention. For example, while embodiments of the present invention generally describe the utilization of a solder paste inspection sensor, an Automatic Optical Inspection (AOI) system used to inspect assembled circuit boards can be similarly modified to accept solder paste print stencils. Using an AOI system in this manner, a stencil can also be inspected in accordance with embodiments of the present invention.

What is claimed is:

1. A solder paste inspection system comprising:
   a stencil mounting bracket located within the solder paste inspection system configured to hold a solder paste printing stencil in position within an inspection region of the solder paste inspection system;
   an image sensor mounted in the solder paste inspection system configured to acquire images of the solder paste printing stencil mounted on the stencil mounting bracket; and
   a controller coupled to the image sensor, wherein the controller generates a solder paste inspection program using the acquired images of the stencil, and uses the generated solder paste inspection program to control operation of the solder paste inspection system.

2. The system of claim 1, wherein the image sensor generates 2D images of the stencil.

3. The system of claim 1, wherein the image sensor generates 3D images of the stencil.

4. The system of claim 1, wherein the stencil mounting bracket is placed above a circuit board conveyance apparatus.

5. A solder paste inspection system for inspecting solder paste print stencils, the system comprising:
   a stencil mounting bracket located within the solder paste inspection system configured to hold a solder paste printing stencil in a position within an inspection envelope of the solder paste inspection system;
   an image sensor mounted in the solder paste inspection system configured to acquire images of the solder paste printing stencil mounted in the stencil mounting bracket; and
   a controller coupled to the image sensor, the controller being configured to use the acquired images to
   detect defects in the solder paste print stencil, and
   generate a solder paste inspection program to control operation of the solder paste inspection system.

6. The system of claim 5, wherein the image sensor generates 2D images of the stencil.

7. The system of claim 5, wherein the image sensor generates 3D images of the stencil.

8. The system of claim 5, wherein the mounting brackets are placed above the circuit board conveyance apparatus.

9. A method of controlling a solder paste inspection machine, the method comprising:
   mounting a solder paste print stencil inside the solder paste inspection machine;
   capturing at least one image of the solder paste print stencil using a solder paste inspection system sensor;
   detecting the position, shape and size of a plurality of stencil apertures in the at least one captured image;
   generating a solder paste inspection program using the plurality of stencil aperture position, shape and size; and
   controlling the solder paste inspection machine using the generated solder paste inspection program.

10. A method comprising:
   mounting a solder paste print stencil inside a solder paste inspection machine;
   capturing at least one image of the solder paste print stencil using a solder paste inspection system sensor;
   determining the existence of defects on the solder paste print stencil using the at least one image captured by the sensor;
   generating a solder paste inspection program using the captured at least one image of the solder paste print stencil; and
   controlling the solder paste inspection machine using the generated solder paste inspection program.

11. A method of verifying a design of a solder paste print stencil, the method comprising:
   mounting the solder paste print stencil inside a solder paste inspection system in a first mounting position with a first side of the solder paste print stencil oriented towards a solder paste inspection system sensor;
   capturing at least one image from the first side of the solder paste print stencil using the solder paste inspection system sensor;
   detecting a position and shape of stencil apertures within the at least one image of the first side of the solder paste print stencil;
   remounting the solder paste print stencil inside the solder paste inspection machine in a second mounting position with a second side of the solder paste print stencil oriented towards the solder paste inspection system sensor;
   capturing at least one image from the second side of the solder paste print stencil using the solder paste inspection system sensor;
   detecting a position and shape of stencil apertures within the at least one image of the second side of the solder paste print stencil;
   comparing the position and shape of stencil apertures on the first side, in the first mounting position, of the solder paste print stencil to the position and shape of stencil apertures on the second side of the solder paste print stencil, in the second mounting position; and
   detecting differences between the first side and second side aperture shapes and positions.

12. The method of claim 11, wherein the shape and size of the first side apertures are compared with the second side apertures to determine a draft angle of the stencil aperture.

* * * * *